United States Patent [19]
Kuroda

[11] Patent Number: 5,838,581
[45] Date of Patent: Nov. 17, 1998

[54] LAYOUT SYSTEM FOR LOGIC CIRCUIT

[75] Inventor: Yasuaki Kuroda, Tokyo, Japan

[73] Assignee: NEC Corporation, Tokyo, Japan

[21] Appl. No.: 723,365

[22] Filed: Sep. 30, 1996

[30]     Foreign Application Priority Data

Sep. 29, 1995  [JP]  Japan .................................. 7-253648

[51] Int. Cl.⁶ .................................................. G06F 17/50
[52] U.S. Cl. ........................ 364/491; 364/489; 364/490
[58] Field of Search .................................. 364/488–491

[56]            References Cited

U.S. PATENT DOCUMENTS

| 5,410,491 | 4/1995 | Minami ................................. 364/491 |
| 5,416,718 | 5/1995 | Yamazaki ............................. 364/488 |
| 5,519,351 | 5/1996 | Matsumoto .......................... 327/295 |
| 5,557,779 | 9/1996 | Minami ................................. 395/500 |
| 5,638,291 | 6/1997 | Li et al. ............................... 364/490 |

FOREIGN PATENT DOCUMENTS 4-282772 10/1992 Japan ............................. G06F 16/50

OTHER PUBLICATIONS

Blair, "Skew–free clock distribution for standard–cell VLSI designs", IEE Proceedings G [Circuits, Devices and Systems], vol. 139, No. 2, Apr. 1992, pp. 265–267.

Cho et al., "A buffer distribution algorithm for high–performance clock net optimization", IEEE Transactions on Very Large Scale Integration [VLSI] Systems, vol. 3, No. 1, Mar. 1995, pp. 84–89.

Chung et al., "Optimal buffered clock tree synthesis", IEEE, Proceedings of the Seventh Annual IEEE International ASIC Conference and Exhibit, 19 Sep. 1994, pp. 130–133.

Fouts, "A phasing adjustment and fanout buffer for distributing clock and control signals in high–speed digital systems", IEEE, Proceedings of the 34th Midwest Symposium on Circuits and Systems, vol. 2, 14 May 1991, pp. 974–977.

Pullela et al., "Skew and Delay Optimization for Reliable Buffered Clock Trees", IEEE, Jan. 1993, pp. 556–562.

Ramanthan et al., "Clock distribution in general VLSI circuits", IEEE Transactions on Circuits and Systems I: Fundamental Theory and Applications, vol. 41, No. 5, May 1994, pp. 395–404.

Ramanthan et al., "A clock distribution scheme for nonsymmetric VLSI circuits", IEEE Comput. Soc. Press, 1989 IEEE International Conference on Computer–Aided Design, 5 Nov. 1989, pp. 398–401.

Saigo et al., "Clock skew reduction approach for standard cell", IEEE, Proceedings of the IEEE 1990 Custom Integrated Circuits Conference, 13 May 1990, pp. 16.4/1–4.

Sherwani et al, "Clock layout for high–performance ASIC based on weighted center algorithm", IEEE, Proceedings of the Fourth Annual IEEE International ASIC Conference and Exhibit, 23 Sep. 1991, pp. P15–5/1–4.

Vittal et al., "Power Optimal Buffered Clock Tree Design", 32nd ACM/IEEE Design Automation Conference, Jan. 1995.

Chen et al. ("An Algorithm for Zero–Skew Clock Tree Routing with Buffer Insertion", Networked Computer Science Technical Reports Library, Accession No. UTEX-AS_CS//CS–TR–95–35, 01 Sep. 1995, pp. 1–23).

Primary Examiner—Kevin J. Teska
Assistant Examiner—Phallaka Kik
Attorney, Agent, or Firm—Foley & Lardner

[57]            ABSTRACT

In a layout system of a logic circuit, a buffer inserted into a critical path is arranged/wired in an arranged region of a circuit block of a primitive layout in such a manner that delay time of the critical path in the primitive layout can be limited to an allowable value. The layout system is comprised of unarranged region information extracting means for extracting a position and a size of an unarranged region from layout data after an arranging/wiring process; virtual node inserting means for inserting a virtual node into a wiring segment located adjacent to the unarranged region, the virtual node constituting a connection point between the wiring segment and the unarranged region; wiring parameter extracting means for extracting a wiring parameter constructed of a wiring resistance and a wiring capacitance of the wiring segment; and path delay time calculating means for calculating delay time of a path based upon the wiring parameter and a delay parameter specific to an element.

4 Claims, 8 Drawing Sheets

FIG. 7(a)

| WIRING SEGMENT | | WIRING PARAMETER | |
|---|---|---|---|
| FROM NODE | TO NODE | CAPACITANCE | RESISTANCE |
| N0 | P0 | C1 | R1 |
| P0 | N1 | C2 | R2 |
| N1 | P1 | C3 | R3 |
| P1 | P2 | C4 | R4 |
| P2 | N2 | C5 | R5 |

FIG. 7(b)

| VIRTUAL NODE | UN-OCCUPIED REGION LIST |
|---|---|
| P0 | E1 |
| P1 | E1 |
| P2 | E2 |

FIG. 7(c)

| UN-OCCUPIED REGION NUMBER | UN-OCCUPIED REGION SIZE | | BUFFER NUMBER LIST |
|---|---|---|---|
| | INITIAL | REMAIN | |
| E1 | 110 | 0 | B1 |
| E2 | 100 | 80 | B2 |

FIG. 7(d)

| BUFFER NUMBER | BUFFER SIZE |
|---|---|
| B1 | 110 |
| B2 | 20 |

LAYOUT SYSTEM FOR LOGIC CIRCUIT

BACKGROUND OF THE INVENTION

1. Field of the Invention

The present invention generally relates to a layout system for a logic circuit, and more specifically, to a layout system capable of correcting delay time of a critical path.

2. Description of the Related Art

Conventionally, in this kind of layout system for a logic circuit, as illustrated in FIG. 1(a), delay time of all paths provided within a circuit, or delay time of an externally designated path is calculated based upon a wiring resistance and a wiring capacitance extracted from primitive (original) layout data and further a precalculated delay time inside an element. Thus, a critical path 200 is specified, and thereafter, a buffer 201 is inserted into this critical path 200 in order to limit the delay time of the critical path 200 to the allowable value, as represented in a layout diagram of FIG. 1(b).

The buffer 201 inserted into the critical path 200 is forcibly arranged on the drive side of this critical path 200, namely a rearranging region 205 is set to a position at the nearest location of a starting point of the path. As a result, the arrangements of the blocks 202 and 203 located near the inserted buffer 201 are changed, and then a wiring line 204 may constitute a new critical path.

Generally speaking, the wiring delay time is increased in proportion to a square value of a wiring length. Therefore, very fine and long wiring lines caused large wiring delays which strongly give influences to a total delay and waveforms propagating on the lines. As a consequence, it is important to divide the critical path by employing buffers so as to shorten the wiring length. As is known in such a method that the path delay time is shortened by inserting the buffers, if a buffer is inserted into the position close to the drive side of the wiring line constituting the critical path, then distortion of a signal wave inputted to this buffer becomes small. Accordingly, the size of this inserted buffer may be made small.

In another conventional layout system as described in Japanese Laid-open Patent Application No. 4-282772, a critical path 300 is specified after calculating several path delay times as shown in the layout diagram of FIGS. 2(a)–(b). Next, another calculation is done to decide a rearranging/wiring region 302 where the path delay time can be limited to the allowable value by inserting the buffer 301 into the critical path 300. Then, the buffer 201 is inserted into this rearranging/wiring region 302, and at the same time, the contents of the rearranging/wiring region 302 are rearranged and rewired. Namely, the arrangements of blocks 304, 305 included in the rearranging/wiring region 302 are changed. As a result, the wiring line 306 may constitute a new critical path.

In the above-described conventional layout system for the logic circuit, the arranging position of the buffer is positionally fixed (FIG. 1(b)), or is located within the rearranging/wiring region calculated from the path delay value (FIG. 2(b)). As a result, the positions of the blocks located near the inserted buffer is changed. Also, since the lengths of the wiring lines connected to these blocks are changed so that the path delay values of these wiring lines are changed.

In other words, since the block arrangements near the buffer are changed due to the buffer inserted in order to correct the critical path, there is a certain possibility that a path which was not a critical path before the buffer insertion becomes a new critical path. In order to correct all of such critical paths newly generated, a iteration process to correct all the critical paths is needed. Such a process requires a huge amount of calculation time.

Generally, all of process operations such as a path delay time calculation, an insertion of buffers into a critical path and arranging/wiring operations of buffers are carried out by using only a layout tool, in a specific case such as a skew correction of a clock tree. However, an general case, both the path delay time calculation and the buffer insertion into the critial path are performed by using the logic synthesis tool, whereas processes such as arranging/wiring the buffers and extracting the wiring parameter from the layout data are executed by using a layout tool.

In general, since the logic synthesis tool is independently provided with the layout tool, a wiring delay is first estimated by using the logic synthesis tool. Then, circuits are synthesized based on this estimated delay, and a net list thereof is transferred to the layout tool. The layout tool executes the arranging/wiring process based on this net list to thereby produce primitive layout data. Furthermore, a wiring parameter such as a wiring capacitance and a wiring resistance on the primitive layout data is extracted, then this extracted wiring parameter is transferred to the logic synthesis tool.

The logic synthesis tool again calculates path delay time by using the corrected wiring parameter of the layout, in order to extract a new critical path. At this time, in a case that the delay time of the extracted critical path is too large, the logic synthesis tool inserts a buffer into the critical path so as to correct this lengthy delay time and produces a new net list. The layout tool again executes the arranging/wiring process based on this new net list to thereby extract a wiring parameter based on this new layout information, which will then be transferred to the logic synthesis tool. Thereafter, the above-described process operations executed between the logic synthesis tool and the layout tool are repeated until all of the critical paths can be limited to the allowable value. Among CAD tools, both the logic synthesis tool and the layout tool are heavy-loaded-tools which therefore require several hours up to several days for the iteration. As a consequence, there is a drawback that the iteration of this process would give great adverse influences to product developing terms.

SUMMARY OF THE INVENTION

The present invention has been made to solve the above-described drawback, and therefore has an object to provide a layout system of a logic circuit, comprising:

Unarranged region information extracting means for extracting a position and a size of an unarranged region from layout data after an arranging/wiring process;

virtual node inserting means for inserting a virtual node into a wiring segment located adjacent to said unarranged region, said virtual node constituting a connection point between said wiring segment and said unarranged region;

wiring parameter extracting means for extracting a wiring parameter constructed of a wiring resistance and a wiring capacitance of said wiring segment;

path delay time calculating means for calculating delay time of a path based upon said wiring parameter and a delay parameter specific to an element;

critical path extracting means for extracting a critical path from said path delay time;

buffer inserting means for determining a size and a position of a buffer inserted into said virtual node of said wiring segment for constituting said critical path based on said path delay time, and said size and position of said unarranged region connected to said virtual node in order to correct said path delay time of said critical path to an allowable value; and buffer arranging/wiring means for arranging/wiring said buffer in said unarranged region connected to said virtual node.

The above and other object, features and advantages of the present invention will be apparent from the following description of preferred embodiments of the invention with reference to the accompanying drawings.

BRIEF DESCRIPTION OF THE DRAWINGS

For a better understanding of the present invention, reference is made of a detailed description to be read in conjunction with the accompanying drawings, in which:

FIGS. 7(a)–(d) are data structural diagrams for indicating a structure of data used in the first layout system of FIG. 3.

DETAILED DESCRIPTION OF THE PREFERRED EMBODIMENTS

Referring now to drawings, a layout system of the present invention will be described.

Figure 1A:
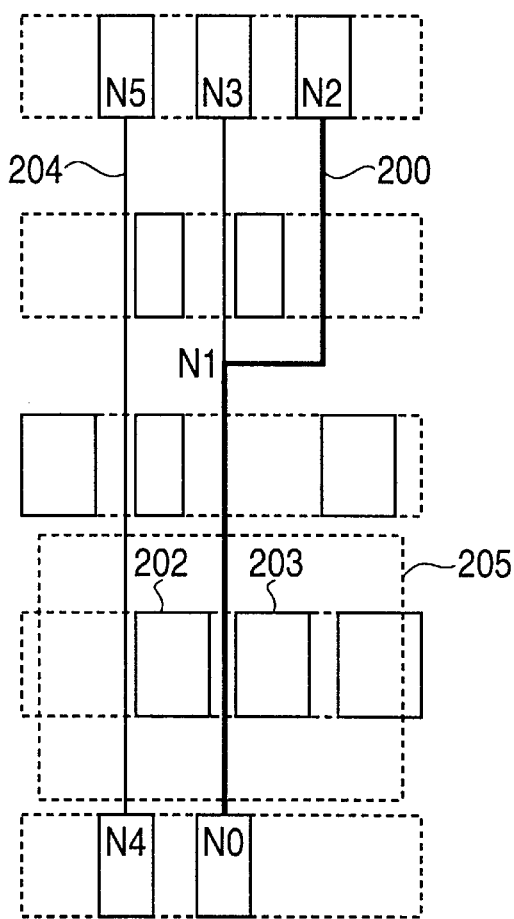
FIGS. 1(a)–(b) schematically illustrate the logic circuit layout diagram generated by the first conventional layout system.
Figure 1B:
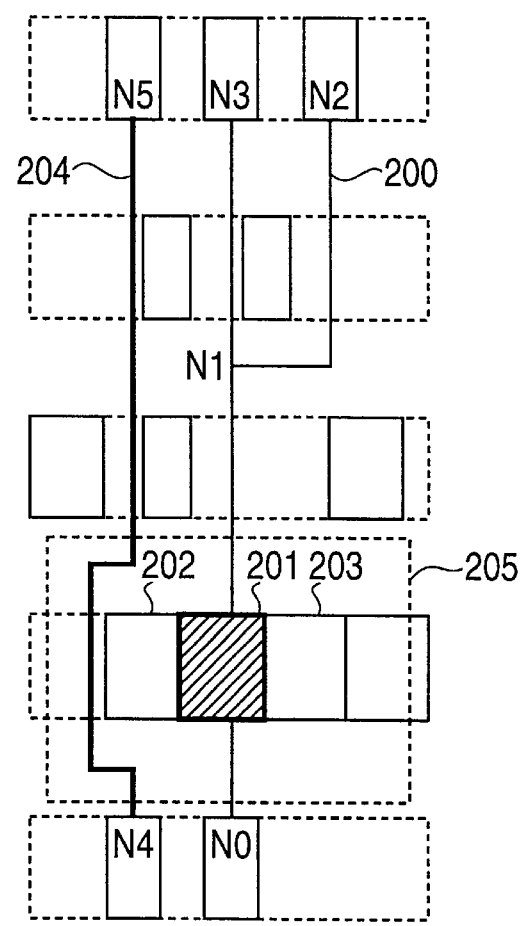
Figure 2A:
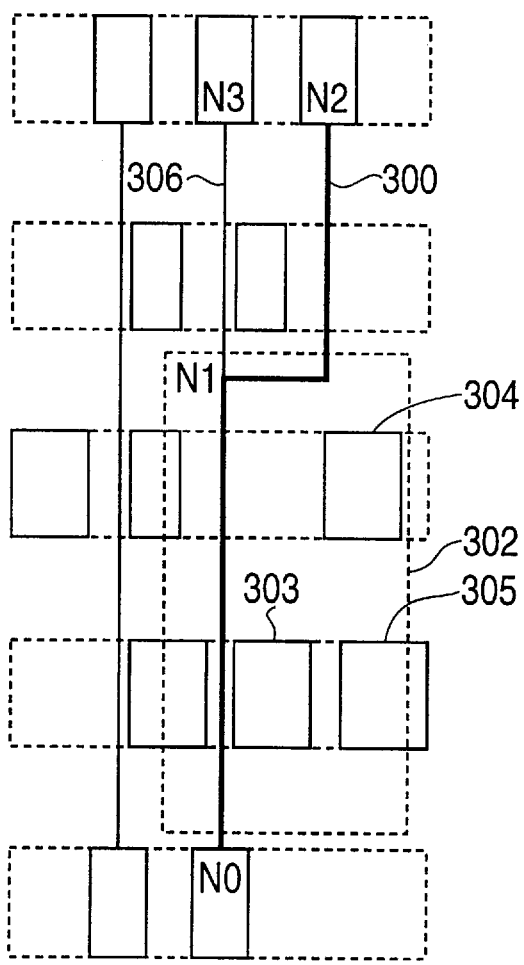
FIGS. 2(a)–(b) schematically illustrate the logic circuit layout diagrams generated by the second conventional layout system.
Figure 2B:
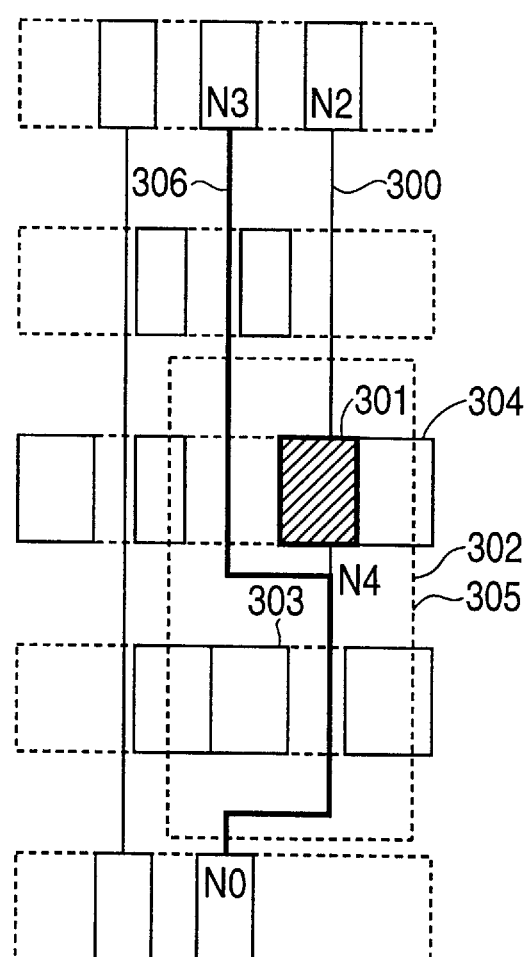
Figure 3:
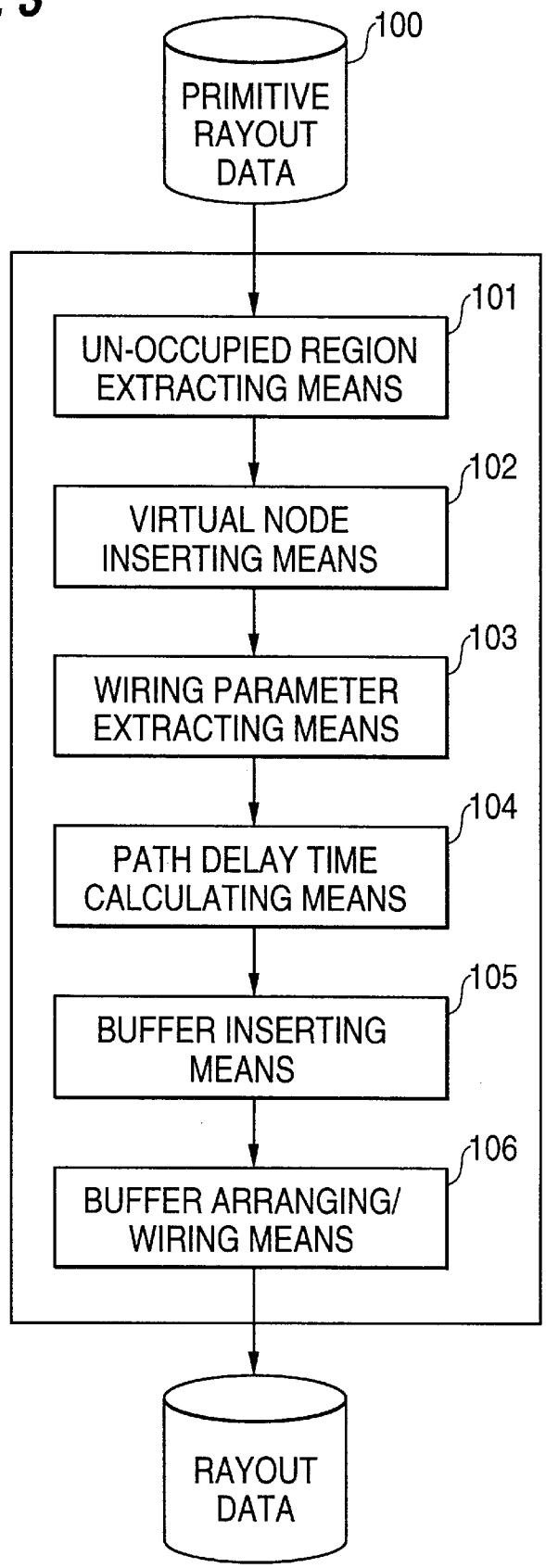
FIG. 3 is a schematic block diagram for showing an arrangement of a layout system according to a first embodiment of the present invention.

First, FIG. 3 is a block chart showing the process for inserting a buffer into a critical path according to a first embodiment of the present invention.

In FIG. 3 a un-occupied cell region extracting means 101 input a primitive layout data 100 outputted from a layout tool and extracts a position and a size of an un-occupied region where no circuit block is arranged. The virtual node inserting means 102 inserts a virtual node into a wiring segment of a critical path. The virtual node assumes a connection node to a buffer arranged in an associated unoccupied region; the wiring parameter extracting means 103 extracts a wiring parameter constructed of a wiring resistance and a wiring capacitance of each wiring segment. The path delay time calculating means 104 calculates a delay time by using the wiring parameters and a delay parameter of circuit elements connected to the wiring segment. The buffer inserting means 105, determines a size and a position of a buffer which must be inserted into a wiring segment of associated critical path to correct the path delay time thereof to an allowable value. The buffer arranging/wiring means 106 arranges the buffer to be inserted in the associated unoccupied region and connectes the buffer to the associated virtual node. These means of this layout system may be realized by a computer program.

Figure 4A:
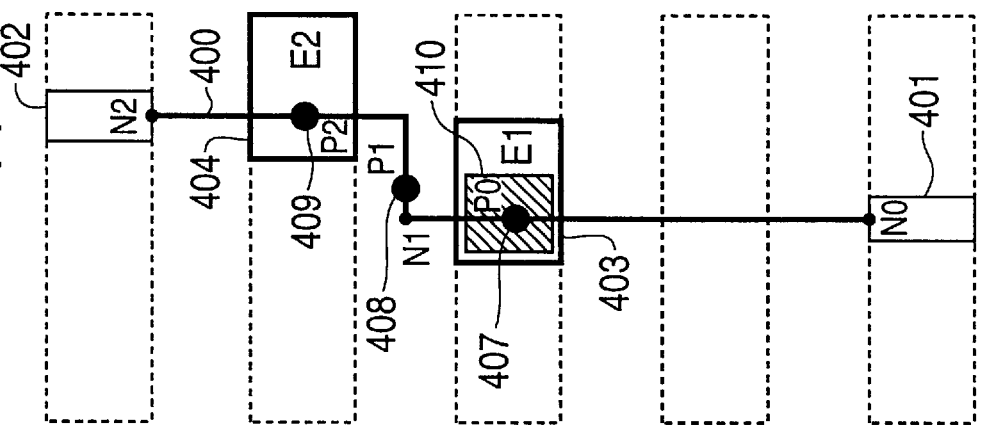
FIGS. 4(a)–(c) schematically indicate a layout diagrams generated by the first layout system of FIG. 3.
Figure 4B:
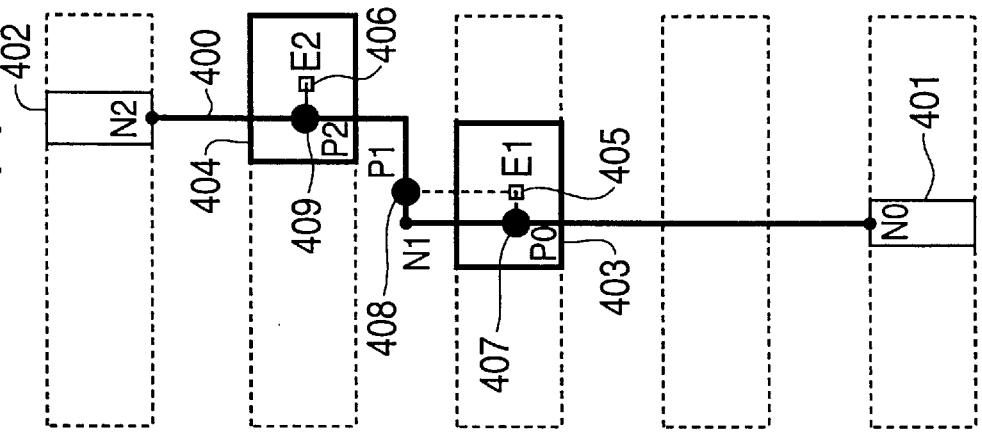

Referring back to the layout diagram shown in FIGS. 4(a)–4(c), it is assumed that the below-mentioned wiring path is recognized as a critical path 400, as a calculation result of path delay values based upon a primitive (original) layout indicated in FIG. 4(a) by using a conventional critical path extraction tool. This wiring path 400 is defined from an N0 node as a starting point via a branch point N1 up to Node N2. The N1 node corresponds to an output terminal of a block 401. The N2 node corresponds to an input terminal of a block 402.

First, the un-occupied region extracting means 101 (FIG. 3) extracts un-occupied regions E1 and E2 through which the critical path 400 passes. Next, as illustrated in FIG. 4(b), the virtual node inserting means inserts nodes P0, P1 and P2 in the critical path 400 by the following manner. Namely, vertical lines are drawn from a center point of the region E1 to associated wiring segment. Then, the nodes P0 and P1 are detected and inserted into the associated wiring segment as vertical nodes where the vertical lines intersect with the associated wiring segment of the critical path 400. Similarly, a vertical node P2 is inserted by the same manner. Each virtual node assumes a connection node to a buffer arranged in an associated un-occupied region.

The critical 400 is subdivided into five wiring segments, namely, N0–P0, P0–N1, N1–P1, P1–P2 and P2–N2. The relation between each wiring segment and associated nodes are stored in the wiring segment table 700 (FIG. 7(a)). And the relation between each vertical node and an associated unoccupied region is stored in the unocupied region list 702 (FIG. 7(b)).

Figure 4C:
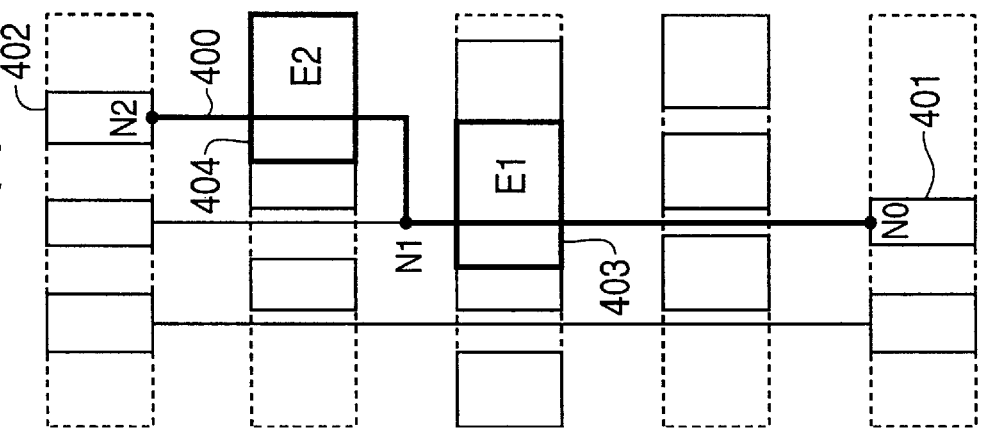

Thereafter, as indicated in FIG. 4(c), a buffer 410 is attached to the virtual nodes from the side of such a virtual node near the starting point of the wiring path until the delay of the critical path 400 becomes to be in range of the allowable value by buffer inserting means and buffer arranging/wiring means. The buffer 410 attached to the virtual nodes is arranged and wired in the associated unoccupied region.

Figure 5A:
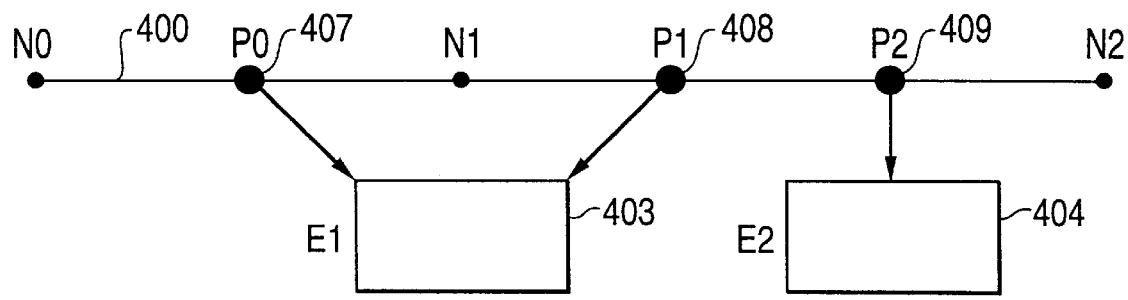
FIGS. 5(a)–(c) are explanatory diagrams for describing a buffer inserting sequence executed in the buffer inserting means of FIG. 3.
Figure 5B:
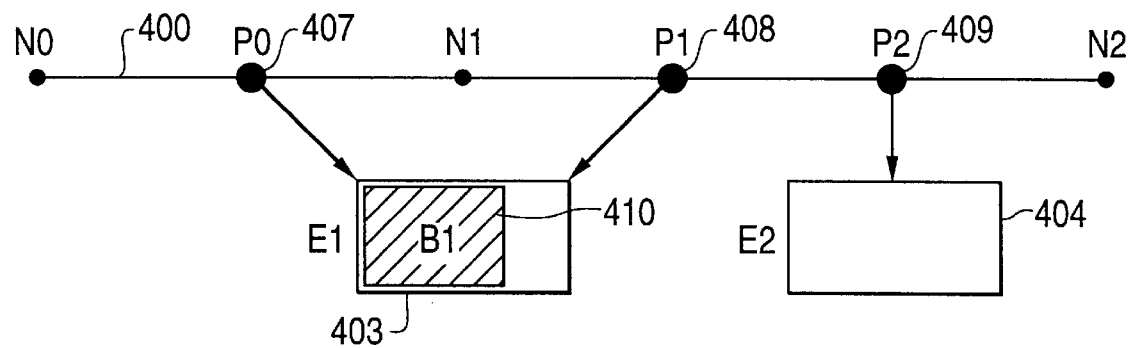
Figure 5C:
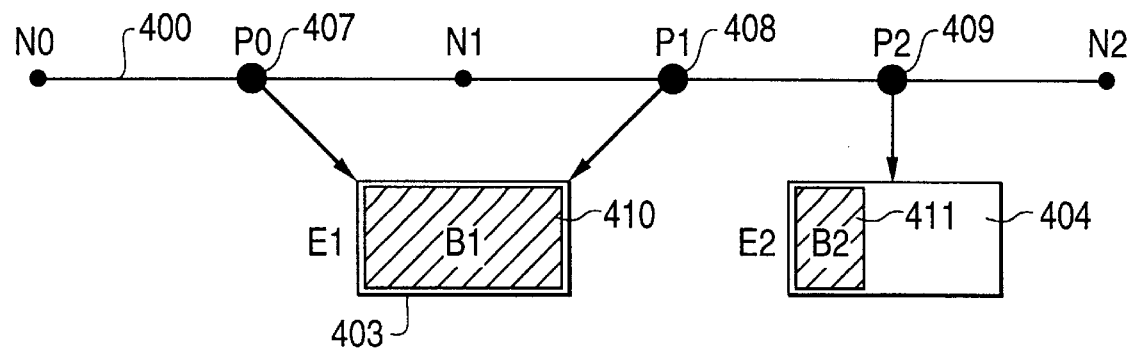

A description will now be made of a relationship between a buffer size inserted into the virtual node of the critical path and a size of the unoccupied region where the virtual node is set to the connection point. FIGS. 5(a)–5(c) pictorially represents a connection relationship between the virtual nodes and the unoccupied regions of FIG. 4(b). FIG. 5(a) shows that the virtual node P0 and P1 are the connection points to the unoccupied region E1, and the virtual node P2 is the connection point to the unoccupied region E2. It should be noted that a blank portion within each unoccupied region indicates a vacant area such that any circuit is not arranged.

FIG. 5(b) indicates such a case that the path delay value of the critical path 400 gets into range of the allowable value by arranging/wiring the buffer 410 in such a manner that the buffer B1 having a size 410 which can be put in the unoccupied region 403 is inserted into the unoccupied region 403 and connected the virtual node P0 located at the nearest point of the starting point of the path. The oblique portion 410 within the region 403 indicates an area used by the buffer E1.

Figure 6:
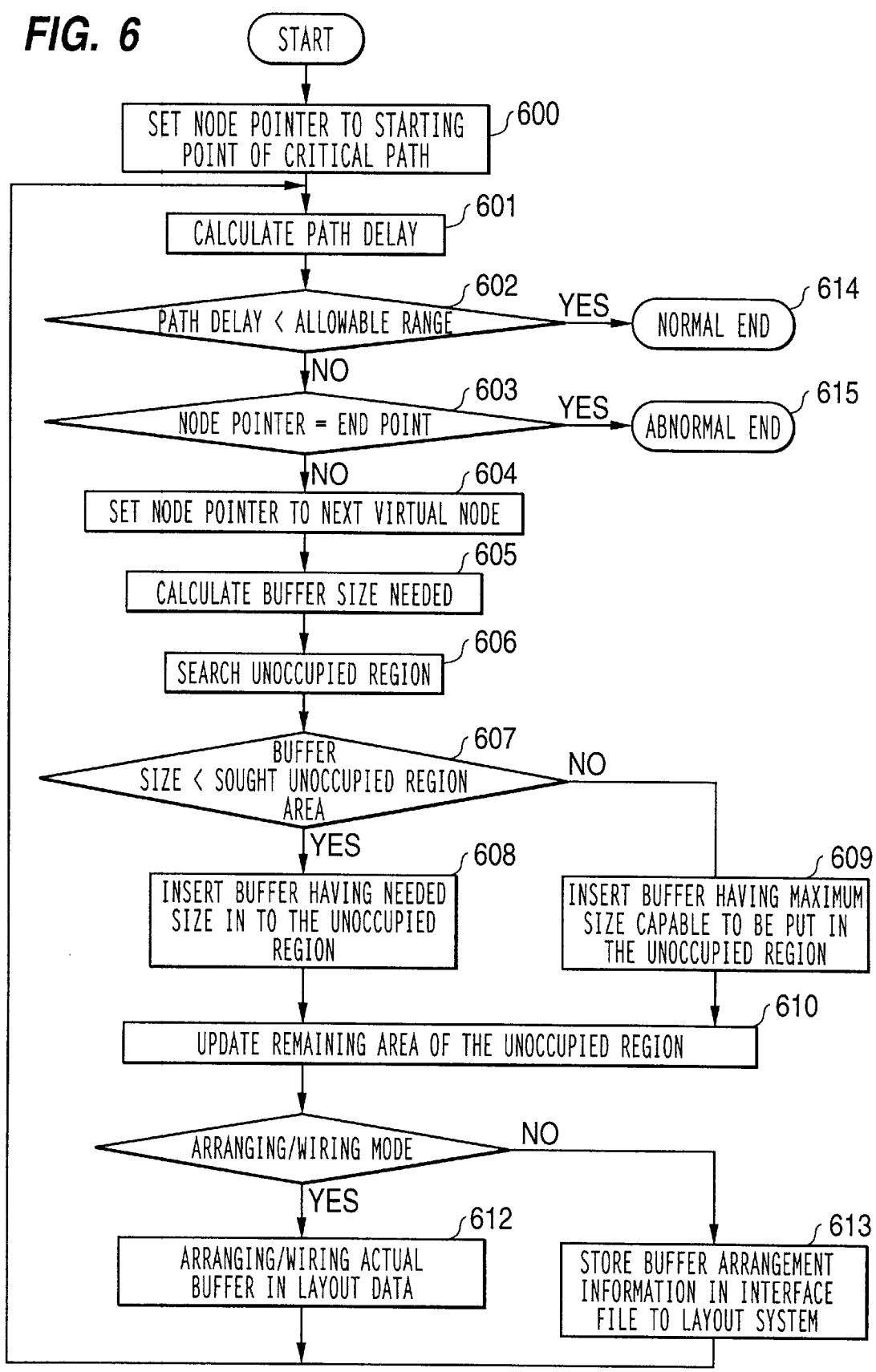
FIG. 6 is a flow chart for explaining process operations of the buffer inserting means and the buffer arranging/wiring means.

FIG. 5(c) represents another case that although the largest buffer which is able to be put in 410 is inserted into the virtual node P0 located at the nearest point of the starting point of the path, the path delay value of the critical path 400 could not be in range of the allowable value. First, the buffer B1 having the maximum size 401, which can be stored in the unoccupied region 403, is inserted into the virtual node P0. The buffer inserting means try to insert another buffer into the virtual node P1 next to the virtual node P0. However, there is no area in which another buffer is arranged in the region 403 where the virtual node P1 assumes the connection point. Accordingly, another buffer is inserted into a next virtual node P2. FIG. 5(*c*) represents such a case that the path delay value of the critical path 400 is adjusted so that the path delay is in range of the allowable value by inserting a buffer B2 having the size 411. Next, a method for determining a buffer size and a method for arranging/wiring a buffer executed in the above-described buffer inserting means 106 and buffer arranging/wiring means 107 will now be explained with reference to a flow chart shown in FIG. 6.

First, a node pointer for pointing out a virtual node on a critical path is set to an output terminal of a circuit block which makes a starting point of the critical path. Subsequently, a path delay value of the critical path is calculated by using a wiring parameter (step 601). When the path delay value is in range of the allowable value, this process is accomplished (steps 602 and 614). When the path delay value is not in range of the allowable value, a check is done whether or not the node pointer points out an end point of the path (step 603). When the node pointer points out the end point, this fact indicates that the path delay value of the critical path could not be in range of the allowable value while the buffer is inserted into the critical path. Accordingly, this process operation is ended under abnormal condition. In this case, the peripheral portion along the critical path is rearranged in a similar manner like the conventional layout system (step 615).

When the node pointer does not point out the end point, the node pointer is set to the next virtual node (step 604). Next, a buffer size inserted into the virtual node is determined (605). It is now assumed that distortion of an input wave to a starting circuit block of the path is "Trf1", an equivalent capacitance and resistance from node N0 to Node N2 are "Ca" and "Ra", respectively. Further, it is assumed that the path delay value from the output terminal of the block 401 to the end block 402 is TBL1 (Trf1, Ca, Ra) that is calculated previously taking account into Trf1, Ca and Ra. Also, it is now assumed that distortion of an input wave to a virtual node P0 is "Trf2", an equivalent capacitance and resistance from node P0 to the end point of the path are "Cb" and "Rb", respectively. And a path delay value from node P0 (an output terminal of a buffer inserted into the virtual node) to the next block 402 is TBL2 (Trf2, Cb, Rb) that is calculated previously taking account into Trf2, Cb and Rb.

Assuming that an internal delay value from an input terminal to an output terminal of the inserted buffer is "Tpd0", a buffer having a minimum size is selected from a plurality of buffers having different sizes which have been previously prepared so that the next equation (1) is satisfied (605).

$$TBL1\ (Trf1, Ca, Ra) + Tpd0 + TBL2\ (Trf2, Cb, Rb) < \text{allowable value} \quad (1)$$

Here, each equivalent capacitance/resistance is calculated by suming wiring parameter 701 of associated wiring segments. Next, the buffer arranging/wiring means 107 seeks unoccupied regions for putting the buffer along the critical path. First, the means 107 picks up the unoccupied region useable to arrange the buffer by using the unoccupied region number list 702 corresponding to the virtual node by utilizing a data structure shown in FIG. 7(*b*). The information of the respective unoccupied regions is managed by a data structure shown in FIG. 7(*c*). The information about the unoccupied region is constituted by an initial size 703 of the unoccupied region, a remaining unoccupied region size 704 left after the buffer inserted and a buffer number list 705 for storing a buffer number of the inserted buffer.

Next, the remaining unoccupied region size 704 is read from the information about the unoccupied region pointed out by the unoccupied region number derived from the unoccupied region list 702, and then an unoccupied region having a maximum size among them in selected.

Both the buffer size to be inserted into the virtual node of the critical path and the size of the unoccupied region used to arranged this buffer have been defined during the above-explained process, so that the buffer size is compared with the remained region size (step 607). In the case that the buffer size is smaller than the remaining region size, a buffer size 706 is recorded in a data structure shown in FIG. 7(*d*), a buffer identification number is stored in a buffer number list 705 shown in FIG. 7(*c*), and the buffer size 706 is subtracted from the remaining size 704 of the unoccupied region (steps 608, 610). In the case that the buffer size is larger than the remaining region size, a buffer size 706 with a maximum size 110 which can be arranged in the unoccupied region is recorded in the data structure shown in FIG. 7(*d*). Further, a buffer identification number is stored in the buffer number list 705 shown in FIG. 7(*c*) and the buffer size 706 with a maximum size 110 which can be arranged in the unarranged region is subtracted from the remaining size 704 of the unarranged region (steps 609, 610).

Next, a check is made of an arranging/wiring mode for externally instructing whether the process for arranging/wiring the buffer in the unoccupied region is immediately executed or only the information necessary for the buffer arranging/wiring process is produced and the buffer arranging/wiring process is not executed (step 611). When the present invention is realized in an automatic arranging/wiring system, the buffer is immediately arranged/wired in the unoccupied region in accordance with the information held in the data structure shown in FIG. 7(*a*) to FIG. 7(*d*) (step 612). On the other hand, when the present invention is realized in a logic synthesis system, the memory information held in the data structure shown in FIG. 7(*a*) to FIG. 7(*d*) is stored in an interface file to be transferred to the automatic arranging/wiring system. The automatic arranging/wiring system arranges/wires the buffer into the unoccupied region in accordance with the information stored in the interface file (step 613).

The above-described process operation is applied to the virtual node on the critical path from the starting point of the path, and then is repeated until the path delay value of the critical path comes into range of the allowable value or the node pointer reaches the end point of this path.

Figure 8A:
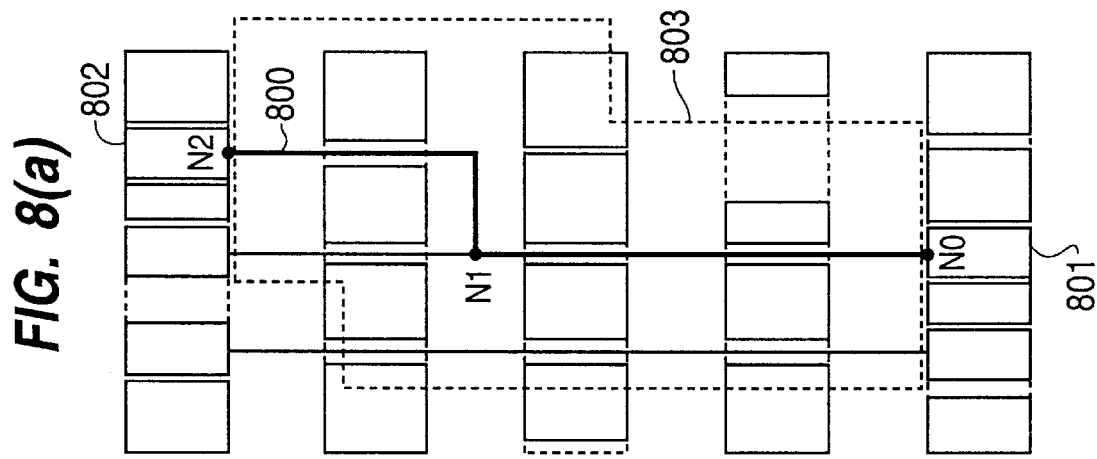
FIGS. 8(a)–(c) schematically show layout diagrams generated by a layout system according to a second embodiment of the present invention.
Figure 8B:
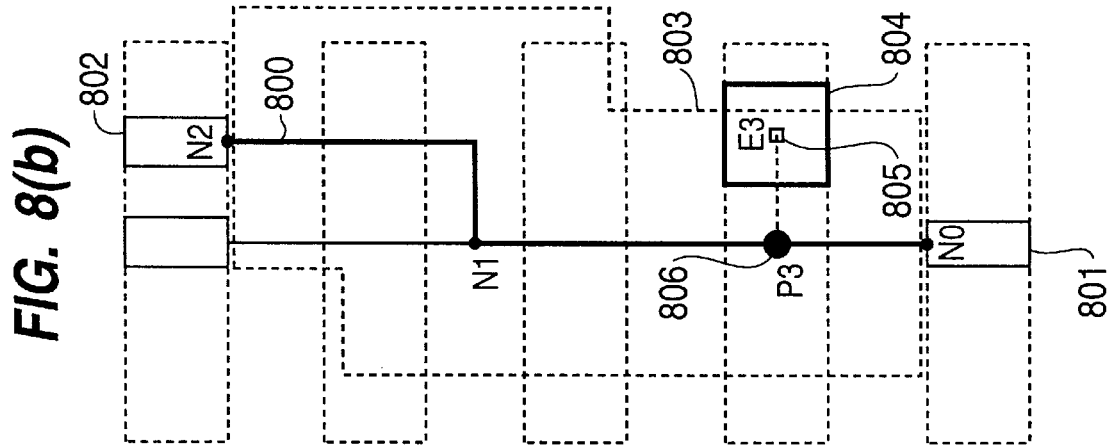
Figure 8C:
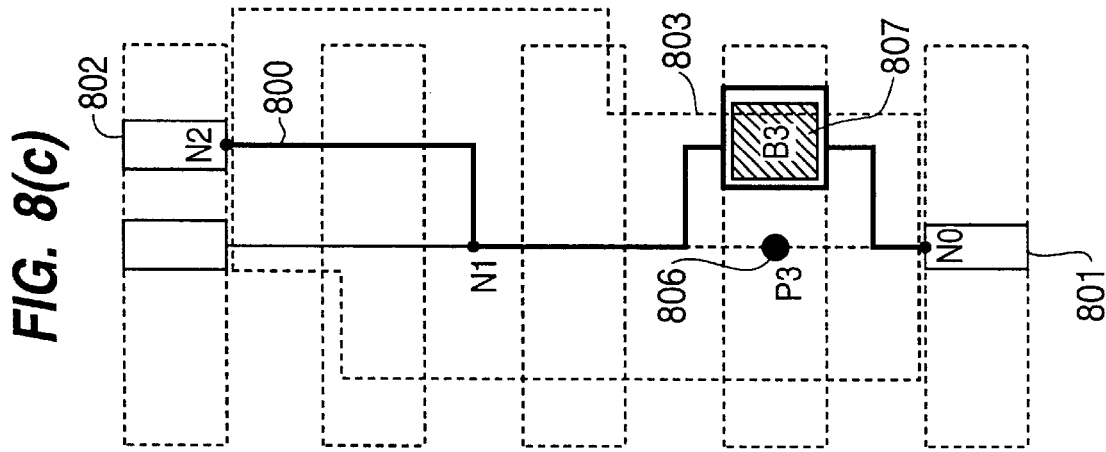

Referring now to a drawing, a second embodiment of the present invention will be explained. FIGS. 8(*a*)–8(*c*) are layout diagrams produced by the layout system according to the second embodiment of the present invention. In a primitive layout of FIG. 8(*a*), it is now assumed that a path from an output terminal of a block 801 as a starting point an input terminal N2 of a block 802 is a critical path.

First, a search region 803 for seeking an unoccupied region capable to be put a buffer therein is defined so that the region boundary line of the search region is set to a distance "R" from the critical path, here "R" is defined by the following equation (2)

$$R = K/U \qquad (2)$$

where symbol "K" denotes a constant value exclusively determined by the design rule used and symbol "U" represents a cell use rate.

Next, the unoccupied region existing in the search region 803 is seeked to thereby extract an unoccupied region E3 having area 804. Then, as shown in FIG. 8(*b*), a vertical line is drawn from a center point 805 of the region E3 to the wiring segment of the critical path 800. A node P3 is set as a virtual node. Then, a record is make such that the P3 virtual node 806 constitutes a connection point to the region E3.

The critical path 800 is subdivided into three wiring segments, namely, N0–P3, P3–N1 and N1–N2. At this time, a wiring capacitance and a wiring resistance are calculated for each of these wiring segments based upon the wiring length of the wiring segment, and then, the calculation result is recorded.

Subsequently, as indicated in FIG. 8(*c*), a buffer E1 having area 807 is inserted into the virtual nodes from such a virtual node near the starting point of the wiring path until the delay of the critical path 800 can be limited to the allowable value by buffer inserting means and buffer arranging/wiring means. The buffer 807 to be inserted into each of the virtual nodes is arranged and wired in an unarranged region where the virtual node is set as the connection point.

It should be noted that the present invention is particularly suitable for cell base integrated circuits and gate array type integrated circuits.

As previously described, in accordance with the present invention, the buffer inserted into the critical path is arranged and wired in the unarranged region of the circuit block in order that the delay time of the critical path in the primitive layout can be limited to the allowable value. As a consequence, there is no risk that the inserted buffer may change the arrangements of the blocks near the critical path and the wiring lines between the blocks, so that another critical path is newly produced. This risk occurs in the conventional layout system. Conventionally, the logic combining system and the automatic arranging/wiring system, which require several hours to several days in a single process operation, should be repeatedly performed three times or more in order to converge all the critical paths present within the primitive layout into the allowable value. To the contrary, since it could be realized only once according to the present invention, there is an advantage that the processing time can be shortened by ⅓, as compared with the conventional layout system.

What is claimed is:

1. A layout system for adjusting a delay of a critical path in a logic circuit comprising:

critical path extracting means for extracting said critical path in a primitive layout data;

unoccupied region extracting means for extracting a region unoccupied with a circuit block along said critical path in said primitive layout data;

size calculating means for calculating a buffer size for adjusting said delay of said critical path into a range of a allowable delay; and buffer inserting means for inserting a buffer into said region unoccupied with said circuit block.

2. The layout system as claimed in claim 1, wherein said unoccupied region extracting means extracts said region having a maximum size among unoccupied regions in which said critical path running through.

3. The layout system as claimed in claim 1, wherein said buffer inserting means inserts a buffer having said buffer size when said buffer size is smaller than said region extracted by said unoccupied region extracting means and a buffer having a maximum size capable to be arranged in said region extracted by said unoccupied region extracting means.

4. The layout system as claimed in claim 3 further comprising means for invoking said unoccupied region extracting means, size calculating means and said buffer inserting means until there is not any more unoccupied region in which said critical path running through.

* * * * *